United States Patent
Kidambi (10) Patent No.: US 8,558,725 B2
(45) Date of Patent: Oct. 15, 2013

(54) ROBUST GAIN AND PHASE CALIBRATION METHOD FOR A TIME-INTERLEAVED ANALOG-TO-DIGITAL CONVERTER

(75) Inventor: Sunder S. Kidambi, Austin, TX (US)

(73) Assignee: Intersil Americas Inc., Milpitas, CA (US)

( * ) Notice: Subject to any disclaimer, the term of this patent is extended or adjusted under 35 U.S.C. 154(b) by 100 days.

(21) Appl. No.: 13/271,383

(22) Filed: Oct. 12, 2011

(65) Prior Publication Data

US 2012/0268299 A1  Oct. 25, 2012

Related U.S. Application Data

(60) Provisional application No. 61/407,217, filed on Oct. 27, 2010.

(51) Int. Cl.
*H03M 1/06* (2006.01)
(52) U.S. Cl.
USPC .......................................... 341/118; 341/155
(58) Field of Classification Search
USPC .................. 341/143, 155, 141, 118, 120, 159
See application file for complete search history.

(56) References Cited

U.S. PATENT DOCUMENTS

| | | | |
|---|---|---|---|
| 5,767,665 A * | 6/1998 | Morita et al. | 324/76.52 |
| 6,518,905 B2 * | 2/2003 | Siferd | 341/143 |
| 7,169,650 B2 * | 1/2007 | Rinella et al. | 438/119 |
| 7,336,729 B2 | 2/2008 | Agazzi | |
| 7,501,967 B2 | 3/2009 | Drazclmayr et al. | |
| 7,551,114 B2 | 6/2009 | Joy et al. | |
| 7,693,214 B2 | 4/2010 | Shida | |
| 7,839,313 B2 | 11/2010 | Kidambi | |
| 7,916,051 B1 * | 3/2011 | Sestok et al. | 341/120 |
| 8,063,803 B2 * | 11/2011 | Kidambi | 341/118 |
| 2011/0234439 A1 * | 9/2011 | Nishi | 341/155 |

* cited by examiner

*Primary Examiner* — Peguy Jean Pierre
(74) *Attorney, Agent, or Firm* — Cesari and McKenna, LLP (57) ABSTRACT

A time-interleaved analog to digital converter (TIADC) that uses a digital filter to remove sampling-frequency symmetries that might otherwise degrade error correction. In an embodiment, two Analog to Digital Converter (ADC) cores provide a set of two ADC outputs. Interleaving the digital signals output by the ADC cores forms a digital representation of the input signal. The ADC cores have an offset correction input, a gain correction input, or a sample time correction input. Prior to estimating one or more of these errors, the ADC core output signals are filtered, with the filtering depending upon expected aliasing characteristics of the input signal.

25 Claims, 12 Drawing Sheets

ROBUST GAIN AND PHASE CALIBRATION METHOD FOR A TIME-INTERLEAVED ANALOG-TO-DIGITAL CONVERTER

CROSS REFERENCE TO RELATED APPLICATION(S)

This application claims priority to U.S. Provisional Patent Application Ser. No. 61/407,217 filed Oct. 27, 2010 by Sunder S. Kidambi, entitled "Robust Gain and Phase Calibration Method for a Two-Channel Time-Interleaved Analog-to-Digital Converter". The entire teachings of the above-referenced application(s) are hereby incorporated by reference.

BACKGROUND OF THE INVENTION

The increasing demand for higher bandwidth in digital communication, instrumentation, sensors, computer peripherals, and other electronic devices and systems continues to drive a corresponding a need for higher speed and higher resolution Analog to Digital Converters (ADCs). A single ADC core circuit implemented in current integrated circuit (IC) technologies cannot meet the conversion requirements of such applications while maintaining low production costs.

An efficient method of providing higher sample rates is to use a parallel combination of slower analog-to-digital converter (ADC) core circuits in a time-interleaved fashion. An M-channel time-interleaved ADC system includes M ADC cores, each operating at a sample rate of 1/M of the overall desired system sample rate. In the absence of any impairments, component or manufacturing variations, or other mismatches among the operating characteristics of the ADC cores, the resulting time-multiplexed output samples are identical to that of a single ideal ADC operating at the system sample rate. In practice, however, there are always mismatches between the different ADCs which can degrade the performance of the ADC system. The commonly occurring mismatches manifest themselves as differences in offset, gain and phase of the ADC cores. In other words, the offsets and gains of all the ADC cores are not the same, and the ADC cores do not all sample at exactly uniform instants of the system sample frequency.

SUMMARY OF PREFERRED EMBODIMENTS

The focus in this patent application is on a time-interleaved ADC (TIADC) system of the type where the gain and phase mismatch errors can be expected to manifest at $\pm F_{in}+F_s/2$, where $F_{in}$ is an input signal frequency and $F_s$ is the sample frequency of the TIADC system.

However, if the input signal has components that are evenly distributed around $F_s/4$, it is impossible to distinguish between the desired input signal components and error signal components, or spurs, due to such gain and phase mismatches. Consequently, any adaptive correction circuit or algorithm that performs gain and phase correction based on the entire spectrum of the signal is bound to exhibit problems in convergence. It should also be mentioned that a signal exactly at $F_s/4$ is a degenerate case of signals symmetric around $F_s/14$.

The heretofore known correction algorithms have in general used the entire spectrum of the input signal. Consequently, under the input conditions mentioned above, it becomes impossible to distinguish between the signal frequency components and the spurs due to the impairments, thereby exhibiting problems in convergence of the adaptive correction.

We present an approach herein that remedies this problem by making the algorithms robust against signal conditions mentioned above. The input signal is known or assumed to have an unused spectrum anywhere within the Nyquist frequency of the overall ADC. For example, in a two-channel TIADC where M equals 2, the unused spectrum manifests as an unaliased region in each of the spectra of the individual ADC outputs. This unaliased spectrum in each ADC output is then filtered by an appropriate digital filter to obtain signals that are free from any kind of symmetry mentioned above, prior to application of the adaptive correction.

With the addition of such filtering, adaptive correction techniques for gain and phase mismatch correction can now be effectively used. As but one example, a correction algorithm applied to a two-channel TIADC may be implemented by a Digital Signal Processor (DSP) that corrects for gain error by measuring an error signal based on a difference in power of the first and second digital signals produced by the two ADC cores, or estimate sample-time and/or phase error by determining a correlation between the two ADC output signals. Other adaptive techniques such as those described in issued U.S. Pat. No. 7,839,323 entitled "Error Estimation and Correction in a Two-Channel Time Interleaved Analog to Digital Converter", which is hereby incorporated by reference in its entirety, may be used.

The digital filters may be selectively inserted into the signal path between the ADC outputs and the DSP that implements the correction. This disables the filters and omits use of the entire input signal spectrum for correction when the input signal is known to not have any content that will result in aliasing, and enables the filters to remove the portions causing the aliasing when they are known to exist.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF A PREFERRED EMBODIMENT

A description of example embodiments of the invention follows.

Introduction

At a high level, this disclosure concerns a TIADC where signal processing elements adaptively detect and correct for errors such as offset, gain, and sample time error. In a preferred embodiment, the solution is a mixed signal implementation where errors are detected in digital circuits, and corrected by applying an analog feedback signal to control the ADC cores. Of specific interest is the use of a digital filter to select only certain components of the ADC output spectra to be fed to the error detection and correction functions. Mathematical models describing the filter and characterization of its effect on the errors and corresponding detection and correction techniques are developed as well.

It should be understood that the signal processing elements for error detection and correction described herein may be embodied as analog or digital circuits, and the digital signal components as program code executing in a programmable digital signal processor, a more general purpose programmed digital computer, as Application Specific Integrated Circuits (ASICs), Field Programmable Gate Arrays (FPGAs), combinatorial logic circuits, a combination of one or more of the same, or in other ways.

In one preferred embodiment described herein we deal specifically with a two-channel TIADC system where the input signal is sampled by two ADC core circuits whose sampling instants are separated in phase by $\pi$ radians. In other words, if $T_s=1/F_s$ is the sampling time of the overall TIADC system, one ADC core samples every $2nT_s$ instants while the other ADC core samples at every $(2n+1)T_s$ instants, thereby providing samples at an overall rate of $T_s$.

Figure 1:
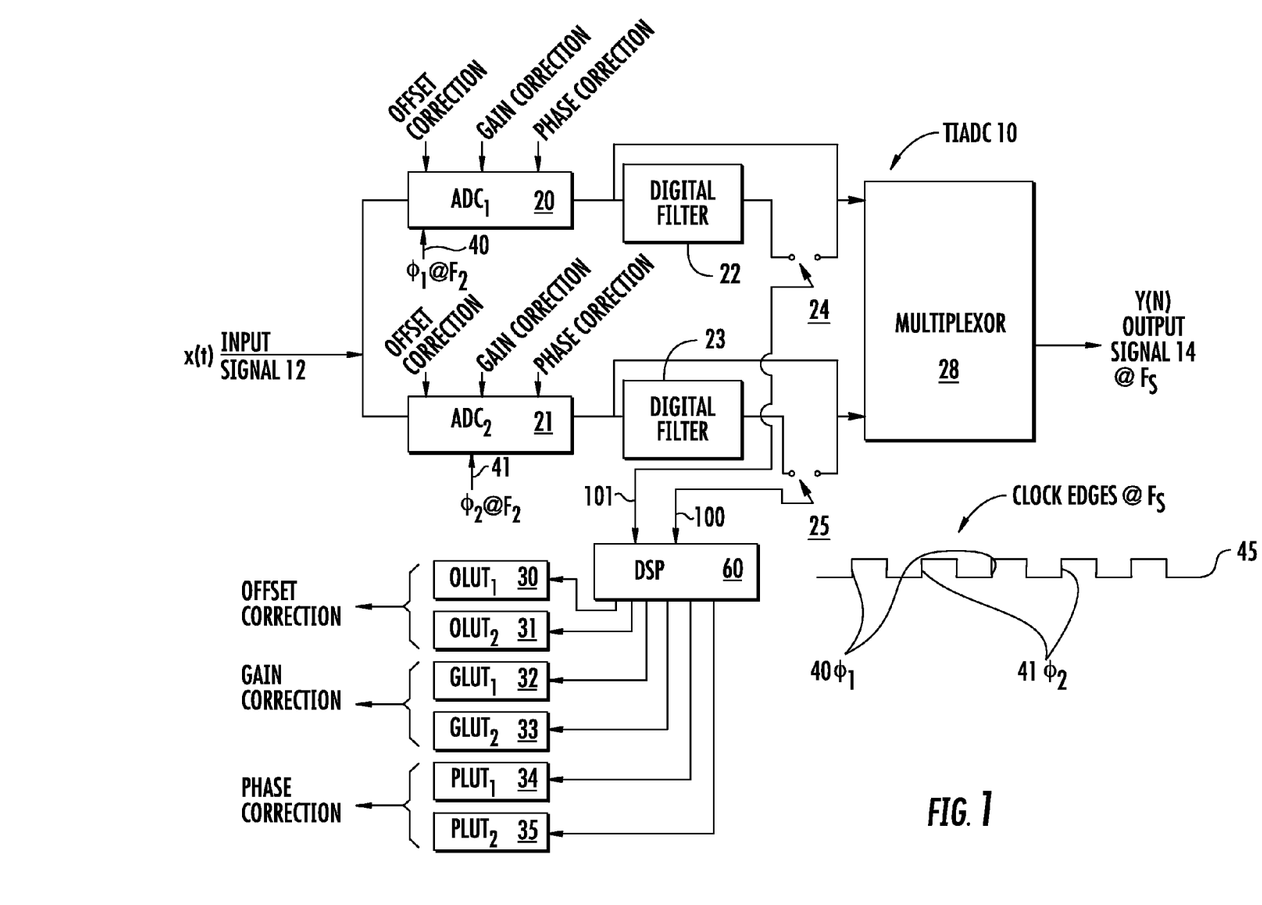
FIG. 1 is a block diagram of an example embodiment of a Time Interleaved Analog to Digital Converter (TIADC) that uses filters as described herein.

FIG. 1 is a block diagram that shows an example of such a two-channel TIADC 10. The TIADC 10 may have a bit width of 12 bits and operate at sample frequency $F_s$ of 400 Msps. Alternative embodiments may operate at faster or slower sample rates and with larger or smaller bit widths.

Two analog-to-digital converter (ADC) cores 20 and 21 operate on an analog input signal 12, represented as x(t), to provide a digital output signal 14, represented as y(n). The ADC cores 20, 21 may each be charge domain pipelined ADC cores. The ADC cores 20 and 21 sample and hold the input signal 12 at alternating sample time instants defined above (e.g., every $2nT_s$ instants for core 20 and every $(2n+1)T_s$ instants for core 21. The sample time instants in this embodiment are controlled by odd rising edges 40 ($\phi_1$) and even rising edges 41 ($\phi_2$), respectively, of a clock signal 45. However, it should be understood that there are other possible clock signal implementations, and that, in other embodiments, a phase shifter may be arranged between the clock signal 45 and the ADC cores 20 and 21; all that matters is that the ADC cores 20 and 21 operate in an alternating fashion.

A multiplexer 28 interleaves the outputs of the two ADC cores 20 and 21, which each provide samples at half the system sample rate, to produce an output signal 14 at the overall system sample rate.

As discussed in more detail below, a pair of digital filters 22, 23 are selectively placed between the output of the ADCs 20, 21 and the input to a Digital Signal Processor (DSP) 60 that detects and corrects for errors. As will be understood after the discussion below, the digital filters 22, 23 attenuate certain signal artifacts that would otherwise cause the error detection and/or correction algorithms, specifically certain types of adaptive gain and phase algorithms, to fail to converge.

Switches 24, 25 are optionally placed to bypass the filters 22, 23 so that the DSP may operate on the unfiltered ADC core 20, 21 outputs under certain conditions.

The digital signal processor (DSP) 60 monitors and corrects offset, gain, and phase errors in the outputs of the ADCs 20 and 21. Switch outputs feed the filtered signals from the ADCs 20 and 21, respectively, into the DSP 60, which computes the error and then applies corresponding correction(s) using a bank of look-up tables (LUTs) 30-35, or a bank of digital-to-analog converters (DACs; not shown), or any other circuit responsive to a digital input that can effect a change in the analog domain. In the embodiment shown in FIG. 1, the ADCs 20 and 21 have corresponding offset LUTs (OLUTs) 30 and 31, gain LUTs (GLUTs) 32 and 33, and phase LUTs (PLUTs) 34 and 35. The DSP 60 processes these detected errors according to adaptive algorithms. The adaptive correction implemented by the DSP may determine a set of selected digital values over a predetermined number of ADC output samples, determine a set of corresponding reference values, compare the set of selected digital values and the set of reference values, to produce a comparison result, and then accumulate the comparison result to provide an error estimate; Specific further details of adaptive algorithms that may be used by the DSP 60 to detect and correct offset, gain and phase errors are presented in an issued U.S. Pat. No. 7,839,323 entitled "Error Estimation and Correction in a Two-Channel Time-Interleaved Analog-to-Digital Converter" by Kidambi, S., and assigned to Intersil Americas, Inc., the assignee of the present application, the entire contents of which are hereby incorporated by reference. However other error detection and correction algorithms may be used.

In preferred embodiments, the DSP 60 estimates the errors in the digital domain and corrects the errors in the analog domain using values stored in the LUTs 30-35, which each typically include a memory. The digital estimation information can be translated into a corresponding analog correction voltage or charge amount using the LUTs 30-35 as interfaces between the digital and analog domains. For example, analog circuits and/or DACs (not shown) can be used to correct relative and/or absolute offset error between the ADCs 20 and 21 based on a digital error signal and the corresponding address value stored in OLUTs 30 and 31. GLUTs 32 and 33 and PLUTs 34 and 35 can also store address values for digital error signals. In effect, the LUTs 30-35 perform digital-to-analog conversion by converting the error into an analog input setting for the ADCs 20 and 21.

Effect of Imperfect Gain and Sample Times

In a practical two-channel TIADC, the gains and sample instants of the two ADCs 20, 21 are not perfect. We will now show the implication of imperfect gains in the two ADCs 20, 21. Let the input signal be characterized by $$x(t)=\cos(\omega_1 t+\phi_1)+\cos(\omega_2 t+\phi_2) \quad (1)$$

where $\omega_1$ and $\omega_2$ are the radial frequencies of the signal and $\phi_1$ and $\phi_2$ are any arbitrary phases. Let us assume, for simplicity, that there is no sampling error in the two ADCs 20, 21. If $G_1$ and $G_2$ are the gains of the two ADCs 20, 21, the output of the TIADC system 10 is given by $$y(n) = G_1 \frac{1-(-1)^{n+1}}{2}\{\cos(\omega_1 nT_s + \phi_1) + \cos(\omega_2 nT_s + \phi_2)\} + \quad (2)$$
$$G_2 \frac{1-(-1)^n}{2}\{\cos(\omega_1 nT_s + \phi_1) + \cos(\omega_2 nT_s + \phi_2)\}$$
$$= \frac{G_1 + G_2}{2}\{\cos(\omega_1 nT_s + \phi_1) + \cos(\omega_2 nT_s + \phi_2)\} +$$
$$(-1)^n \frac{G_1 - G_2}{2}\{\cos(\omega_1 nT_s + \phi_1) + \cos(\omega_2 nT_s + \phi_2)\}$$
$$= G_s\underbrace{\{\cos(\omega_1 nT_s + \phi_1) + \cos(\omega_2 nT_s + \phi_2)\}}_{\text{Image Signal}} +$$
$$G_d\underbrace{\{\cos\left(\left(\omega_1 - \frac{\omega_s}{2}\right)nT_s + \phi_1\right) + \cos\left(\left(\omega_2 - \frac{\omega_s}{2}\right)nT_s + \phi_s\right)\}}_{\text{Image Signal}}$$

where $$G_s = \frac{G_1 + G_2}{2}$$
$$G_d = \frac{G_1 - G_2}{2}$$
$$(-1)^n = \cos(\omega_s nT_s/2)$$

where $\omega_s = 2\pi F_s$ and where we have used the fact that $(-1)^n = \cos(\omega_s nT_s/2)$. It can be seen from eqn. (2) that a gain mismatch between the two ADCs 20, 21 produces an image signal in addition to a scaled input signal. If the input signal is such that $$\omega_1 = \frac{\omega_s}{2} - \omega_2,$$

then from eqn (2) we see that it is impossible to distinguish between the frequency components of the input and image signals. Thus, any adaptive algorithm implemented by the DSP 60 that utilizes the power of the signals from the two ADCs 20, 21 to correct for the gain mismatch between them will not be able distinguish the power of the image signal from the power of the input signal 12.

The above derivation can be extended to a broadband input signal 12 having frequency components that are symmetric with respect to $\omega_s/4$. Thus, power-based algorithms using the entire spectrum cannot be used to correct gain mismatches between the various ADCs in a TIADC system 10 when the input signal 12 has components that are symmetric with respect to the Nyquist frequency of each ADC.

Let us now look at the effect of sample time (phase) errors between the ADC cores in the two-channel case. For simplicity we assume that there is no gain error between the two ADCs 20, 21. We are only interested in the relative difference between the sample instants of the two ADCs. As mentioned above, assume one ADC 20 samples at time instants $2 nT_s$ and the other ADC 21 samples at time instants $(2 n+1)T_s + \Delta t$, where $\Delta t$ is the sampling time error between the two ADCs 20, 21. Assuming the input signal characterized by (1), the output is given by $$y(n) = \cos\left(\omega_1\left(nT_s + \frac{\Delta t}{2} - (-1)^n\frac{\Delta t}{2}\right) + \phi_1\right) + \quad (3)$$
$$\cos\left(\omega_2\left(nT_s + \frac{\Delta t}{2} - (-1)^n\frac{\Delta t}{2}\right) + \phi_2\right)$$
$$= \cos\left(\omega_1\left(nT_s + \frac{\Delta t}{2}\right) + \phi_1\right)\cos\left((-1)^n\frac{\omega_1\Delta t}{2}\right) +$$

-continued
$$\sin\left(\omega_1\left(nT_s + \frac{\Delta t}{2}\right) + \phi_1\right)\sin\left((-1)^n\frac{\omega_1\Delta t}{2}\right) +$$
$$\cos\left(\omega_2\left(nT_s + \frac{\Delta t}{2}\right) + \phi_2\right)\cos\left((-1)^n\frac{\omega_2\Delta t}{2}\right) +$$
$$\sin\left(\omega_2\left(nT_s + \frac{\Delta t}{2}\right) + \phi_2\right)\sin\left((-1)^n\frac{\omega_2\Delta t}{2}\right)$$

Using the identity $(-1)^n = \cos(n\pi)$, we can write the above equation as $$y(n) = \cos\left(\omega_1\left(nT_s + \frac{\Delta t}{2}\right) + \phi_1\right)\cos\left(\frac{\omega_1\Delta t}{2}\right) + \quad (4)$$
$$\sin\left(\omega_1\left(nT_s + \frac{\Delta t}{2}\right) + \phi_1\right)\cos(n\pi)\sin\left(\frac{\omega_1\Delta t}{2}\right) +$$
$$\cos\left(\omega_2\left(nT_s + \frac{\Delta t}{2}\right) + \phi_2\right)\cos\left(\frac{\omega_2\Delta t}{2}\right) +$$
$$\sin\left(\omega_2\left(nT_s + \frac{\Delta t}{2}\right) + \phi_2\right)\cos(n\pi)\sin\left(\frac{\omega_2\Delta t}{2}\right)$$

Using $\sin(a)\cos(n\pi) = \sin(a)\cos(\omega_s nT_s/2) = \sin(a - \omega_s nT_s/2)$, we have $$y(n) = \underbrace{\cos\left(\omega_1 nT_s + \frac{\omega_1\Delta t}{2} + \phi_1\right)\cos\left(\frac{\omega_1\Delta t}{2}\right)}_{\text{Input Signal}} + \quad (5)$$
$$\underbrace{\cos\left(\omega_2 nT_s + \frac{\omega_2\Delta t}{2} + \phi_2\right)\cos\left(\frac{\omega_2\Delta t}{2}\right)}_{\text{Input Signal}} +$$
$$\underbrace{\sin\left(\left(\omega_1 - \frac{\omega_s}{2}\right)nT_s + \frac{\omega_1\Delta t}{2} + \phi_1\right)\sin\left(\frac{\omega_1\Delta t}{2}\right)}_{\text{Image Signal}} +$$
$$\underbrace{\sin\left(\left(\omega_2 - \frac{\omega_s}{2}\right)nT_s + \frac{\omega_2\Delta t}{2} + \phi_2\right)\sin\left(\frac{\omega_2\Delta t}{2}\right)}_{\text{Image Signal}}$$

Again, if the input signal is such that $$\omega_1 = \frac{\omega_s}{2} - \omega_2,$$

then from eqn (5) we see that it is impossible to distinguish between the frequency components of the input and image signals. Such an analysis can be extended to a broadband signal which has frequency components that are symmetric with respect to the Nyquist rate of individual converters.

Certain of the adaptive gain and phase algorithms calibrate gain and phase mismatches, respectively, based on the power of and cross-correlation between the signals from the two ADCs 20, 21. It can now be appreciated that such algorithms may fail to converge in applications where the signals have the kind of symmetric frequencies mentioned above. We now describe a digital filter that can be used under situations where the input signal has such frequency symmetry provided the signal used for correction satisfies a certain condition. In order to describe this approach, we first develop a model of a two-channel analysis/synthesis filter bank system, and then show the equivalence between that and the two-channel TIADC system.

Two-Channel Analysis/Synthesis Filter Bank System

Figure 2:
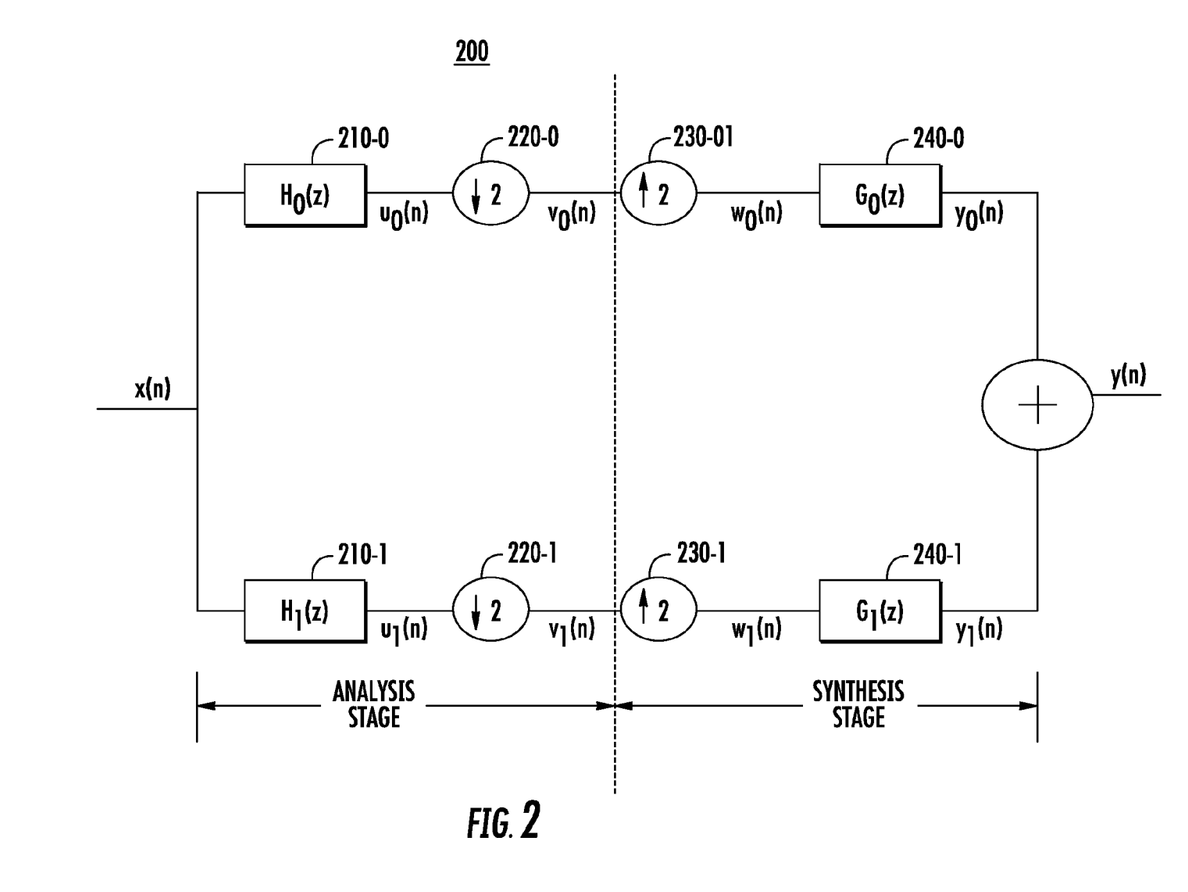
FIG. 2 illustrates a two-channel filter bank that can be used to model a two-channel TIADC implementation.

Consider a two-channel analysis/synthesis filter bank system 200 as shown in FIG. 2. The filter bank system has an analysis stage 210-0, 210-1 and synthesis stage 240-0, 240-1 for each channel. Each channel also has a downsampler 220-0, 220-1 and each synthesis stage has an upsampler 230-0, 230-1. For k=0,1 signals $u_k(n)$ are the output of a respective analysis stage, $v_k(n)$ are the output of the downsampler, $w_k(n)$ the output of the upsampler, and $y_k(n)$ the output of the synthesis stage.

Let $H_0(z)$, $H_1(z)$ represent the transfer functions for the respective analysis stages 210-0, 210-1 and $G_0(z)$, $G_1(z)$ represent the respective transfer functions of the synthesis stages 240-0, 240-1. Let the frequency domain representation for signals $u_k(n)$, $v_k(n)$, $w_k(n)$, and $y_k(n)$, for k=0,1 be given by $U_k(z)$, $V_k(z)$, $W_k(z)$, and $Y_k(z)$, respectively. Further, let x(n) and y(n) be the input and output, respectively, of the two-channel filter bank system 200 and let X(z) and Y(z) be the transfer functions of the input and output, respectively.

Following the signal path shown from input to output in FIG. 2, we can derive the following.

$$U_k(z) = H_k(z)X(z) \quad (6)$$

$$V_k(z) = \frac{1}{2}\left[U_k(z^{\frac{1}{2}}) + U_k(-z^{\frac{1}{2}})\right] \quad (7)$$

$$= \frac{1}{2}\left[H_k(z^{\frac{1}{2}})X(z^{\frac{1}{2}}) + H_k(-z^{\frac{1}{2}})X(-z^{\frac{1}{2}})\right]$$

$$W_k(z) = V_k(z^2) \quad (8)$$

$$= \frac{1}{2}[H_k(z)X(z) + H_k(-z)X(-z)]$$

$$Y_k(z) = G_k(z)W_k(z) \quad (9)$$

$$= \frac{1}{2}[H_k(z)G_k(z)X(z) + H_k(-z)G_k(-z)X(-z)]$$

$$Y(z) = Y_1(z) + Y_2(z) \quad (10)$$

$$= \frac{1}{2}[H_0(z)G_0(z)X(z) + H_0(-z)G_0(-z)X(-z)] +$$

$$\frac{1}{2}[H_1(z)G_1(z)X(z) + H_1(-z)G_1(-z)X(-z)]$$

Re-arranging the terms in the above equation, we get $$Y(z) = \frac{1}{2}[H_0(z)G_0(z) + H_1(z)G_1(z)]X(z) + \quad (11)$$

$$\frac{1}{2}[H_0(-z)G_0(-z) + H_1(-z)G_1(-z)]X(-z) \quad (12)$$

$$= T(z)X(z) + S(z)X(-z) \quad (13)$$

where $$T(z) = \frac{1}{2}[H_0(z)G_0(z) + H_1(z)G_1(z)]$$

$$S(z) = \frac{1}{2}[H_0(-z)G_0(-z) + H_1(-z)G_1(-z)]$$

For perfect reconstruction, i.e., $$Y(z) = cz^{-L}X(z) \quad (14)$$

where c and L are arbitrary gain and delay, respectively, the following conditions must hold:

$$T(z) = cz^{-L} \quad (15)$$

$$S(z) = 0 \quad (16)$$

In order to achieve S(z)=0, we can select $$G_0(z) = -H_1(-z) \quad (17)$$

$$G_1(z) = H_0(-z) \quad (18)$$

Consequently, $$T(z) = \frac{1}{2}[H_0(-z)H_1(z) - H_0(z)H_1(-z)] \quad (19)$$

Relationship Between Two-Channel Filter Bank and Two-Channel TIADC System

Without loss of generality, let us assume a two-channel TIADC system that has no offset mismatch in the two ADCs. Now, let $$H_0(z) = 1$$

$$H_1(z) = gz^{-(1+\delta)}$$

where g and δ are the gain and sample-time error between the two channels of the ADC, respectively. Using eqns. 17 and 18, we can derive the synthesis filters as $$G_0(z) = -g(-z)^{-(1+\delta)} \quad (20)$$

$$G_1(z) = 1 \quad (21)$$

In an ideal two-channel time-interleaved ADC, δ=0 and g=1. Thus $T(z)=z^{-1}$ and hence perfect reconstruction can be achieved. Alternatively, if δ≠0 and g≠1, as in a practical two-channel TIADC, are known beforehand, then $G_0(z)$ can be designed to achieve perfect reconstruction. Since these are not known apriori, we can either estimate them and subsequently design $G_0(z)$ or drive δ and g close to their ideal values in an adaptive fashion. Below, we present a method that permits using the adaptive correction algorithms as described in the above mentioned U.S. Pat. No. 7,839,323.

A Robust Gain and Phase Calibration Method for Two-Channel TIADC

Figure 3:
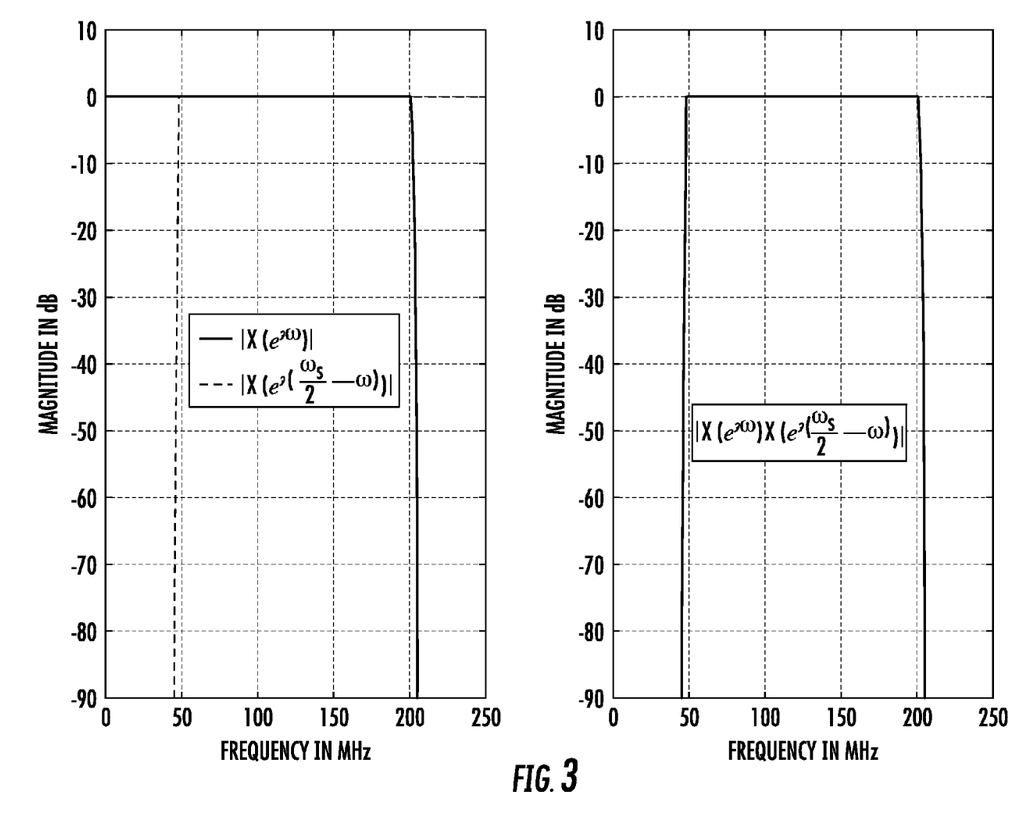
FIG. 3 shows a lowpass spectrum satisfying Equation 22.

It must be understood that in a practical two-channel TIADC, δ≠0 and g≠1. Let us now consider an input signal such that $$|X(e^{j\omega})X(e^{j(\pi-\omega)})| = 0 \quad (22)$$

in a certain region (regions) of the Nyquist bandwidth. FIG. 3 shows a lowpass spectrum which satisfies eqn. (22). Here the sample frequency is assumed to be 500 MHz. The lowpass spectrum occupies a bandwidth of 200 MHz. It can be seen that the regions $0 \leq \omega \leq 0.2\pi$ and $0.8\pi \leq \omega \leq \pi$ it are alias free, but the signal can have symmetric frequency components anywhere between $0.2\pi$ and $0.8\pi$.

Let us now see what the alias-free spectrum means at the output of each ADC core 20, 21. In order to understand this, we rewrite eqn. (7) for individual ADC cores 20, 21 as $$V_0(e^{j\omega}) = \frac{1}{2}\left[X(e^{j\frac{\omega}{2}}) + X(e^{j(\frac{\omega}{2}-\pi)})\right] \quad (23)$$

$$V_1(e^{j\omega}) = \frac{1}{2}\left[ge^{-j(1+\delta)\frac{\omega}{2}}X(e^{j\frac{\omega}{2}}) + ge^{-j(1+\delta)(\frac{\omega}{2}-\pi)}X(e^{j(\frac{\omega}{2}-\pi)})\right] \quad (24)$$

It can easily be seen that in the region $0<\omega<0.4\pi$, the output of each ADC is alias free. Consequently, $$V_0(e^{j\omega}) = X(e^{j\frac{\omega}{2}}) \quad (25)$$

$$V_1(e^{j\omega}) = ge^{-j(1+\delta)\frac{\omega}{2}} X(e^{j\frac{\omega}{2}}) \quad (26)$$

Referring back to FIG. 1, it can now be appreciated that by filtering the signal from the output of each ADC 20, 21 by a respective digital lowpass filter 22, 23, we can obtain an alias-free spectrum from each ADC 20, 21. The lowpass filtered signals can now be used by the DSP 60 to estimate and correct gain and phase mismatches using adaptive algorithms.

Figure 4:
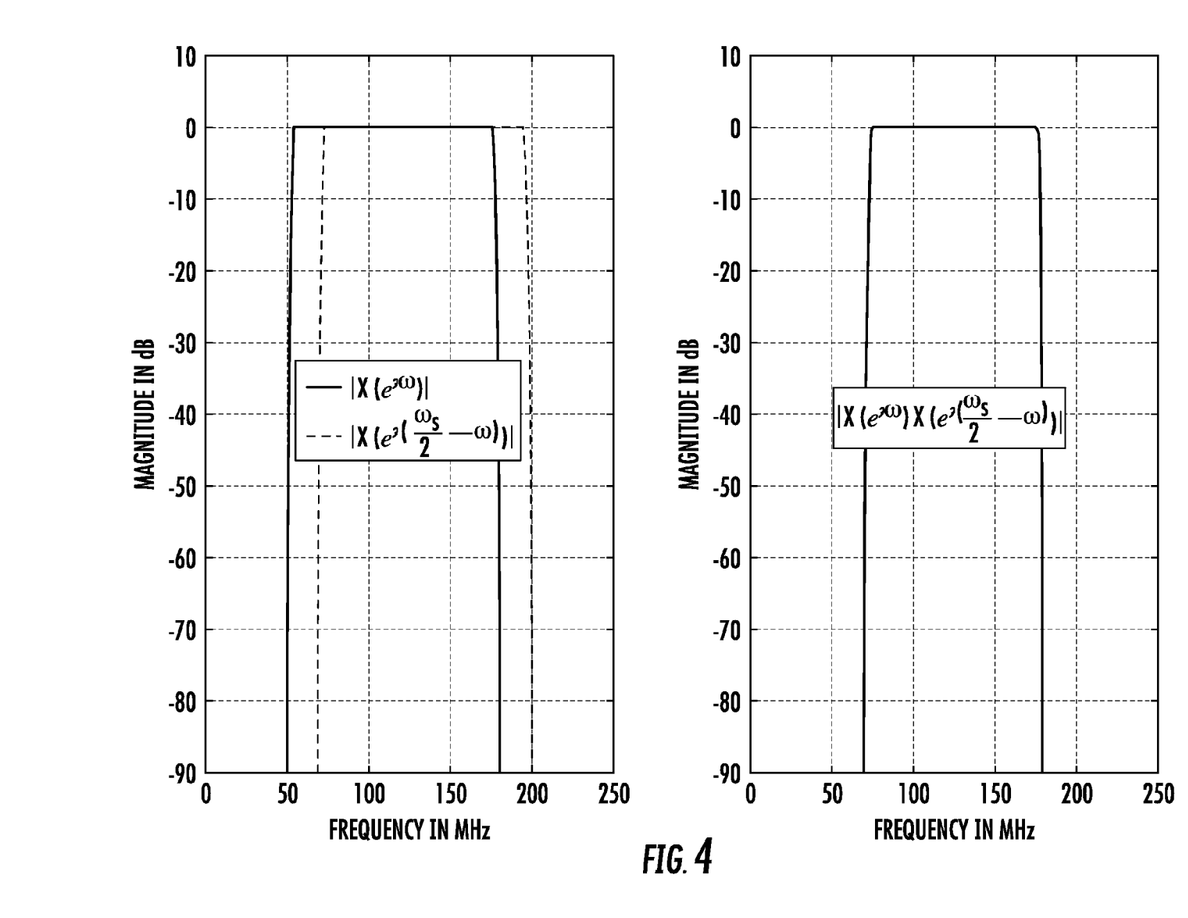
FIG. 4 shows a bandpass spectrum in which $0<\omega_l<\omega_u<\pi$.

FIG. 4 shows a bandpass spectrum in which $0<\omega_l<\omega_u<\pi$. Again, using the same analysis, we can filter the output of each ADC through a bandpass filter having a bandwidth of $2|\pi-(\omega_l+\omega_u)|$.

Filter Design Considerations

The bandpass filtered outputs from the two digital filters 22, 23 can now be used by the DSP 60 to implement adaptive algorithms to estimate and correct gain and phase mismatches in the ADCs. In one embodiment, these filters 22, 23 may be implemented by the Digital Signal Processor (DSP) 60 itself, prior to the DSP performing its gain correction in 310 and/or phase correction 410 functions. In other embodiments, the two digital filters 22, 23 may be implemented as separate DSPs, Field Programmable Gate Arrays (FPGAs), as programs executed by general purpose data processors, hardwired logic circuits, or in other ways, depending upon the sampling rates of the signals present.

The digital filters 22, 23 may be bypassed using switches 24, 25 in certain conditions. For example, it is known that offset correction is not affected by the aliasing problem in the two-channel TIADC system (in other words, the information used to correct offset is located at DC or at the Nyquist frequency, but not at aliased frequencies). Thus, when the DSP 60 is correcting for offset, the switches 24, 25 can be set to bypass the filters 22, 23.

It can sometimes be known in advance whether or not the input signal is of the type that can be expected to introduce aliasing artifacts. For example, when the input signal x(t) originates from a communication system (such as a cellular, cable television, etc. type signal), the bandwidth and frequency characteristics of the input signal might be pre-determined. In such an instance, it may be possible to conclude that the input signal will not introduce aliasing artifacts, and therefore the filters 22, 23 may be bypassed. It may also be possible in some instances, even when the input signal characteristics are not known in advance, to automatically detect the bandwidth and frequency characteristics of the input signal with other circuits and/or signal processors (not shown and described here).

Simulations

Figure 5:
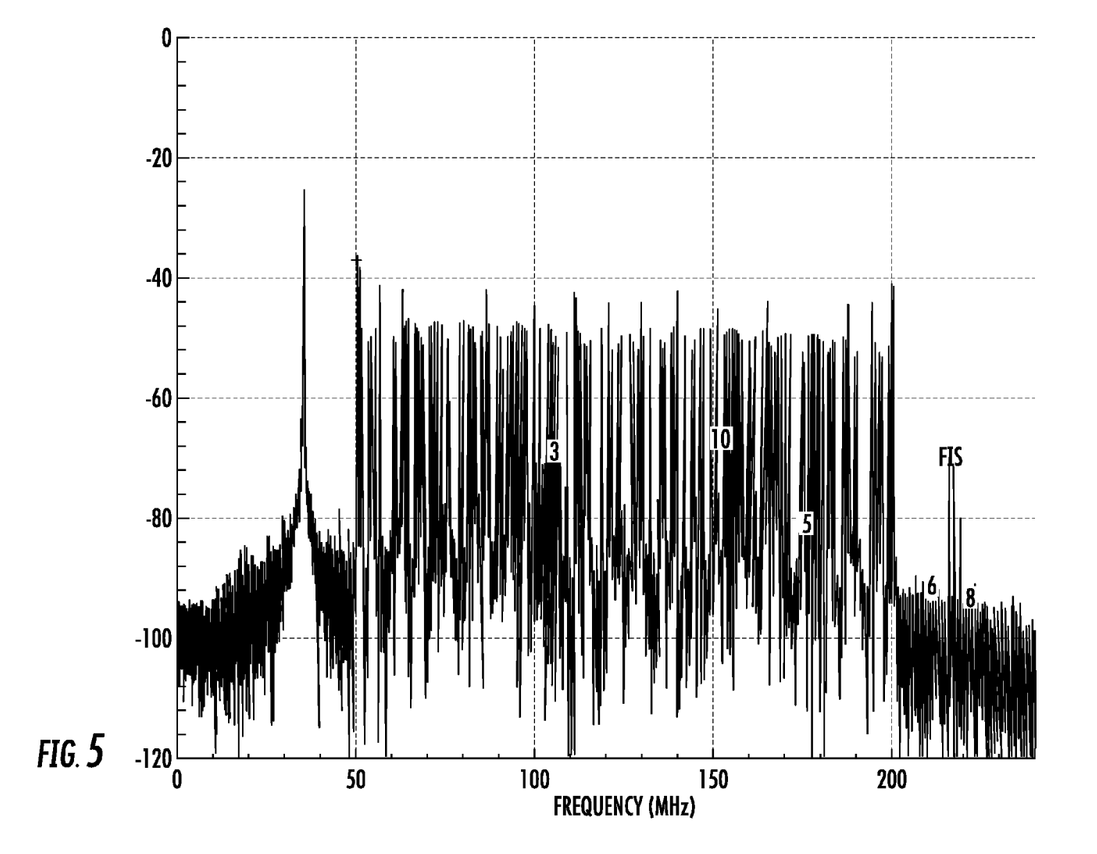
FIG. 5 is a spectrum of a signal with an alias-free region around 20% of Nyquist.

We now show the efficacy of this concept by way of simulations. FIG. 5 shows the spectrum of an input signal that has many pairs of symmetric frequency components from 50 MHz to 200 MHz. It has one tone around 35 MHz. In other words, the signal spectrum is zero (or low) in the region between 80% of Nyquist frequency to Nyquist frequency.

Figure 6:
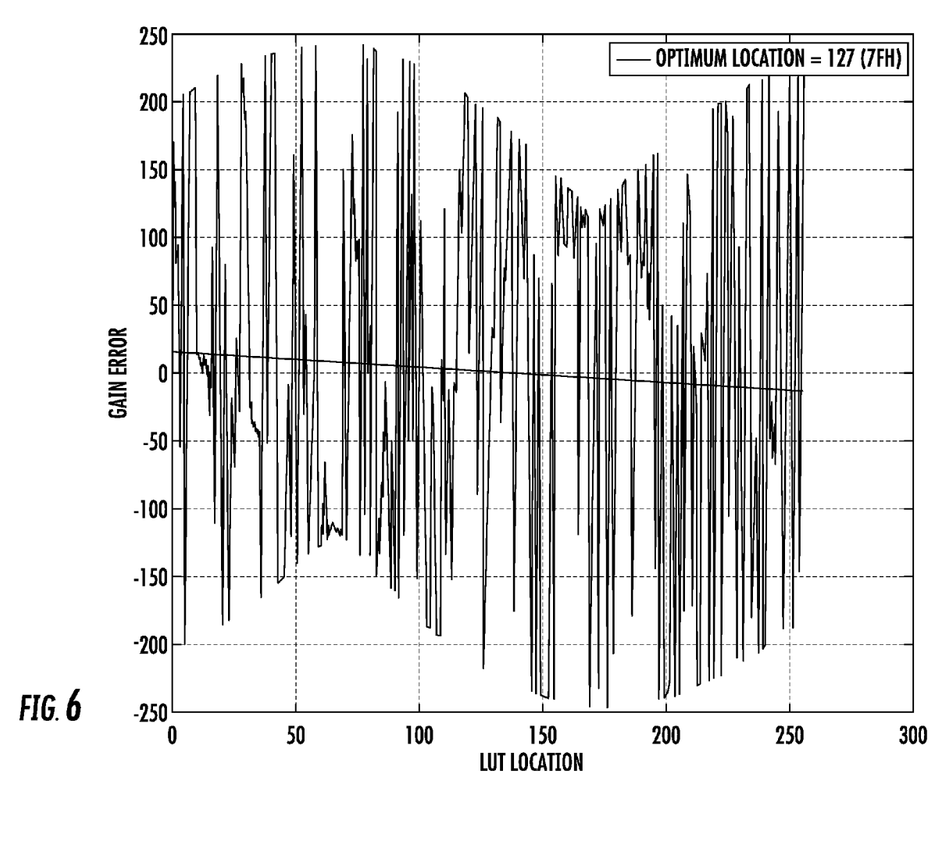
FIG. 6 illustrates gain error variation without the use of a lowpass filter.

FIG. 6 shows the variation of the gain error when the digital filters are not used. As can be seen, the variation of gain error with gain knob values is highly nonlinear and erratic. The adaptive algorithm converges to a wrong value.

Figure 7:
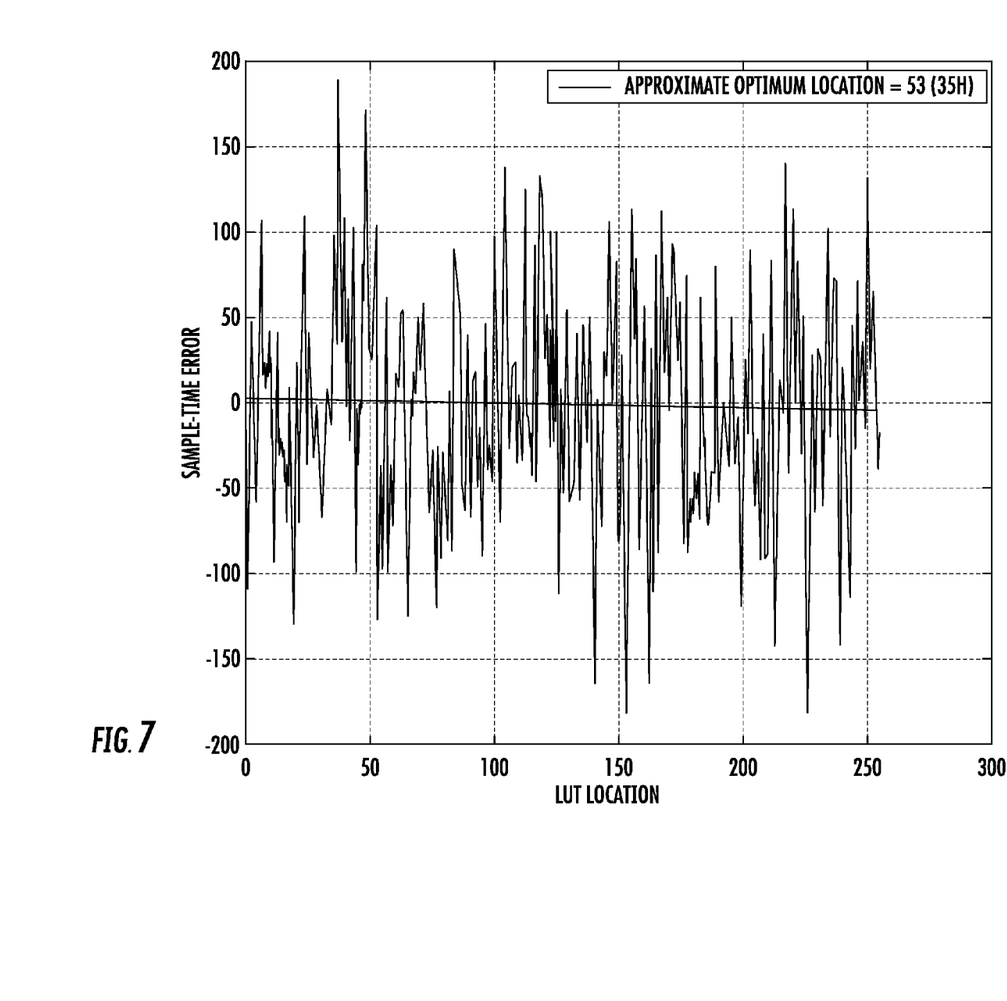
FIG. 7 illustrates phase error variation without the use of a lowpass filter.

Similarly FIG. 7 shows the variation of the phase error when the filters are not used. As can be seen, the phase algorithm does not converge. It must be mentioned that the offset mismatch converges very well as it is not affected by the alias frequencies.

Figure 8:
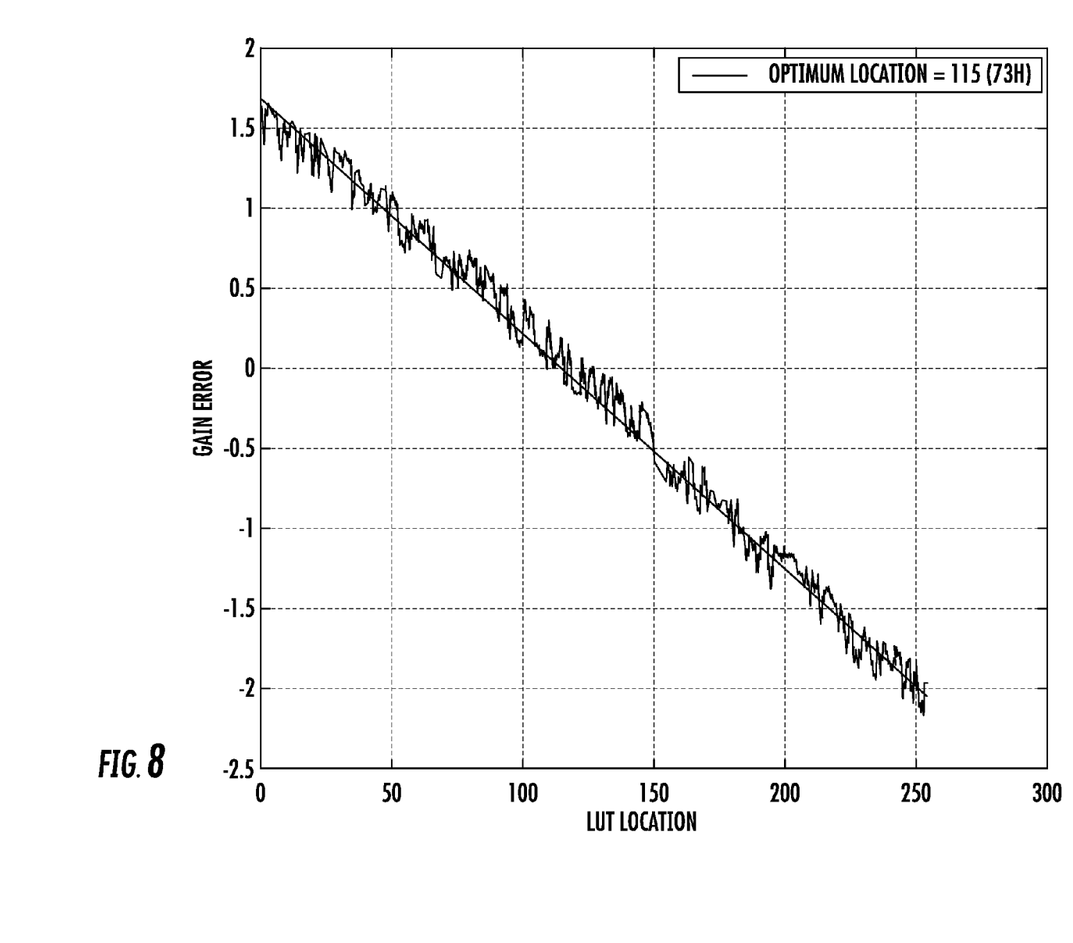
FIG. 8 illustrates gain error variation with the use of a lowpass filter.

Let us now apply the filters such that the filtered signals are used for gain and phase error calculation. The digital filters are assumed here to have a pass-band commensurate with the alias-free region. FIG. 8 shows the variation of the gain error. As can be seen, the error variation is well behaved and the gain algorithm will converge very smoothly.

Figure 9:
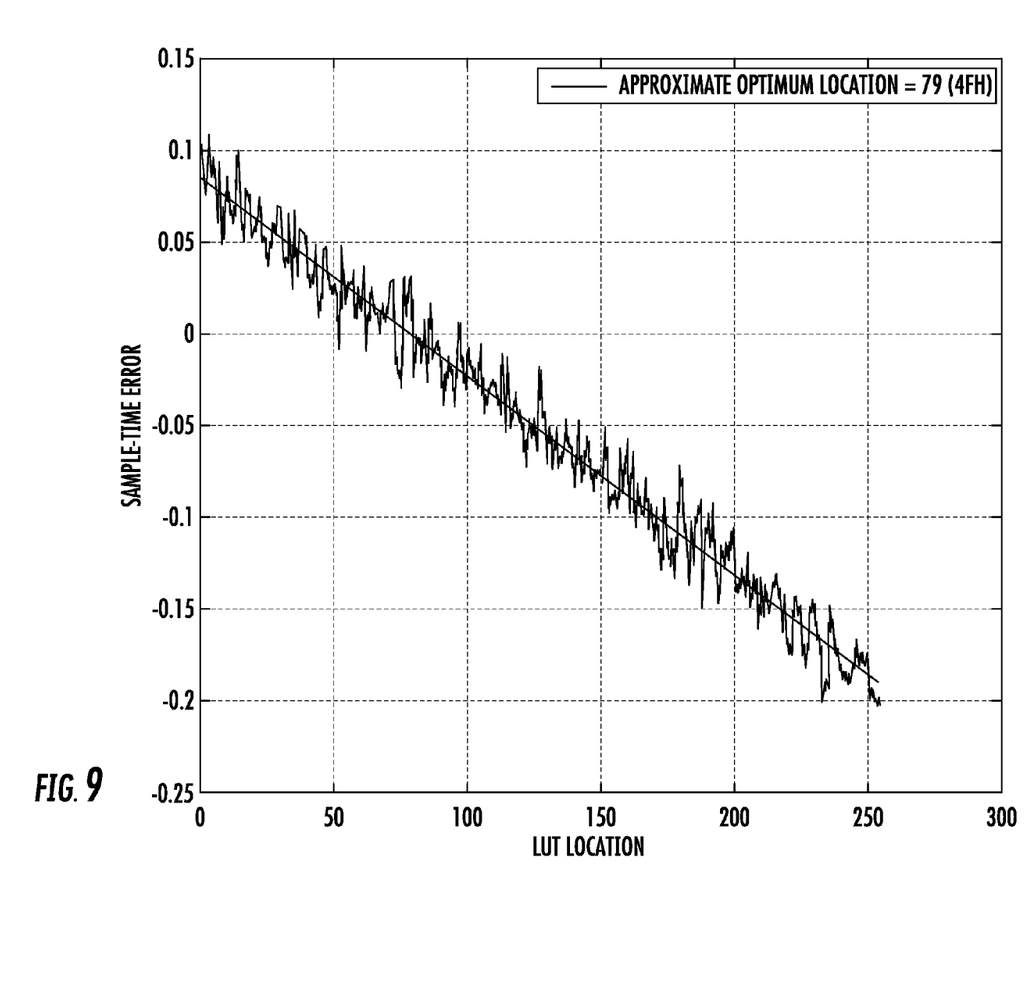
FIG. 9 illustrates phase error variation with the use of a lowpass filter.

Similarly, FIG. 9 shows the variation of the phase error. As can be seen, the phase algorithm will converge without any problem.

Let us now use a broadband signal which occupies about 80% of Nyquist frequency. Consequently, the spectrum is alias-free from DC to 20% of Nyquist frequency.

Figure 10:
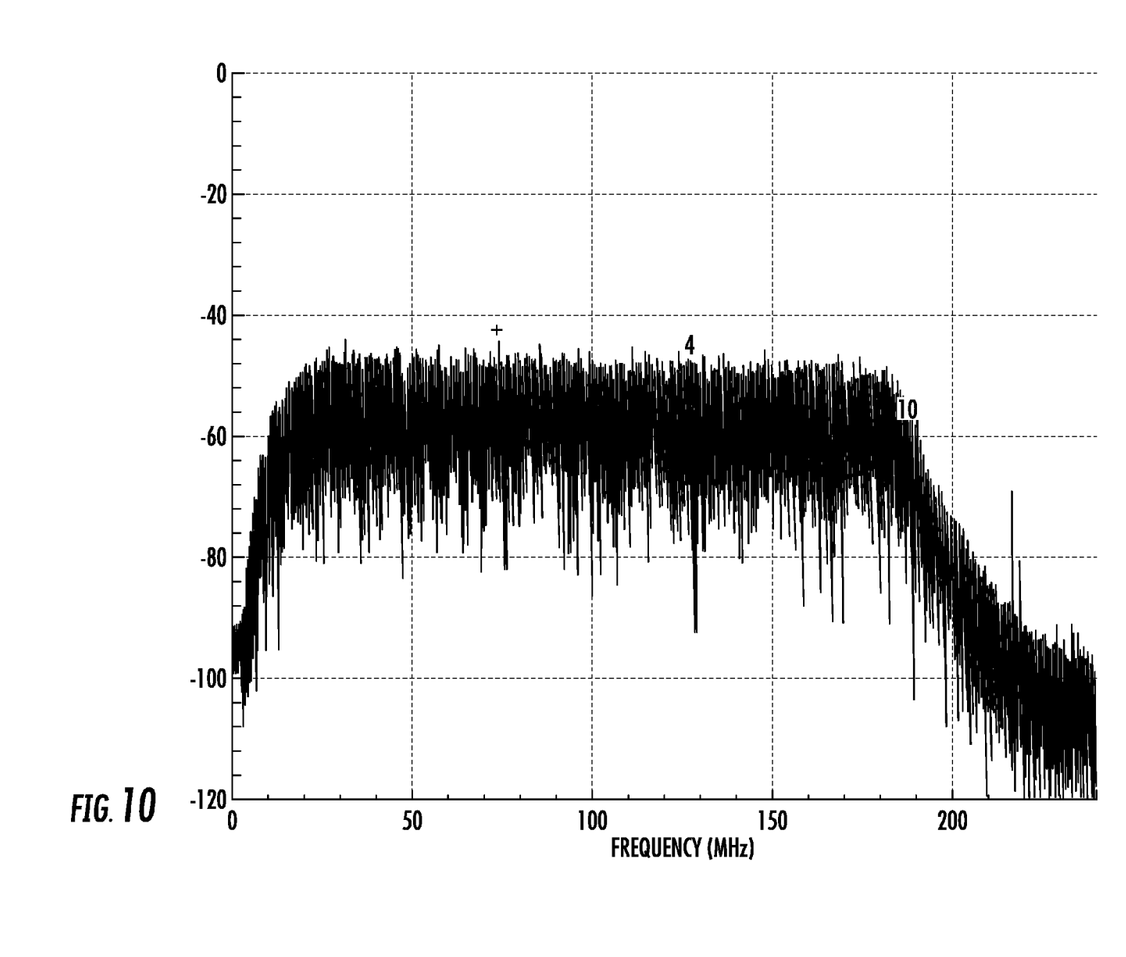
FIG. 10 shows a spectrum of a broadband signal with low energy from 80% Nyquist to Nyquist.
Figure 11:
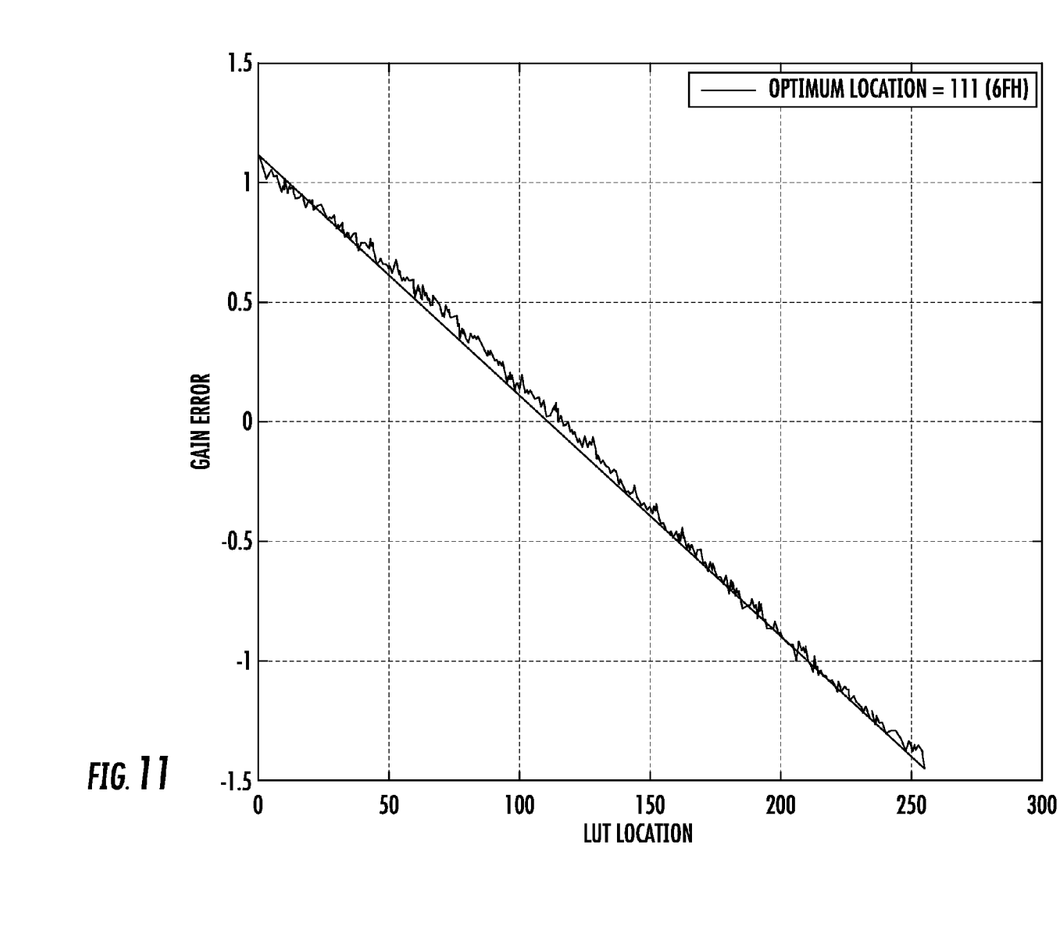
FIG. 11 illustrates gain error variation with the use of a lowpass filter.
Figure 12:
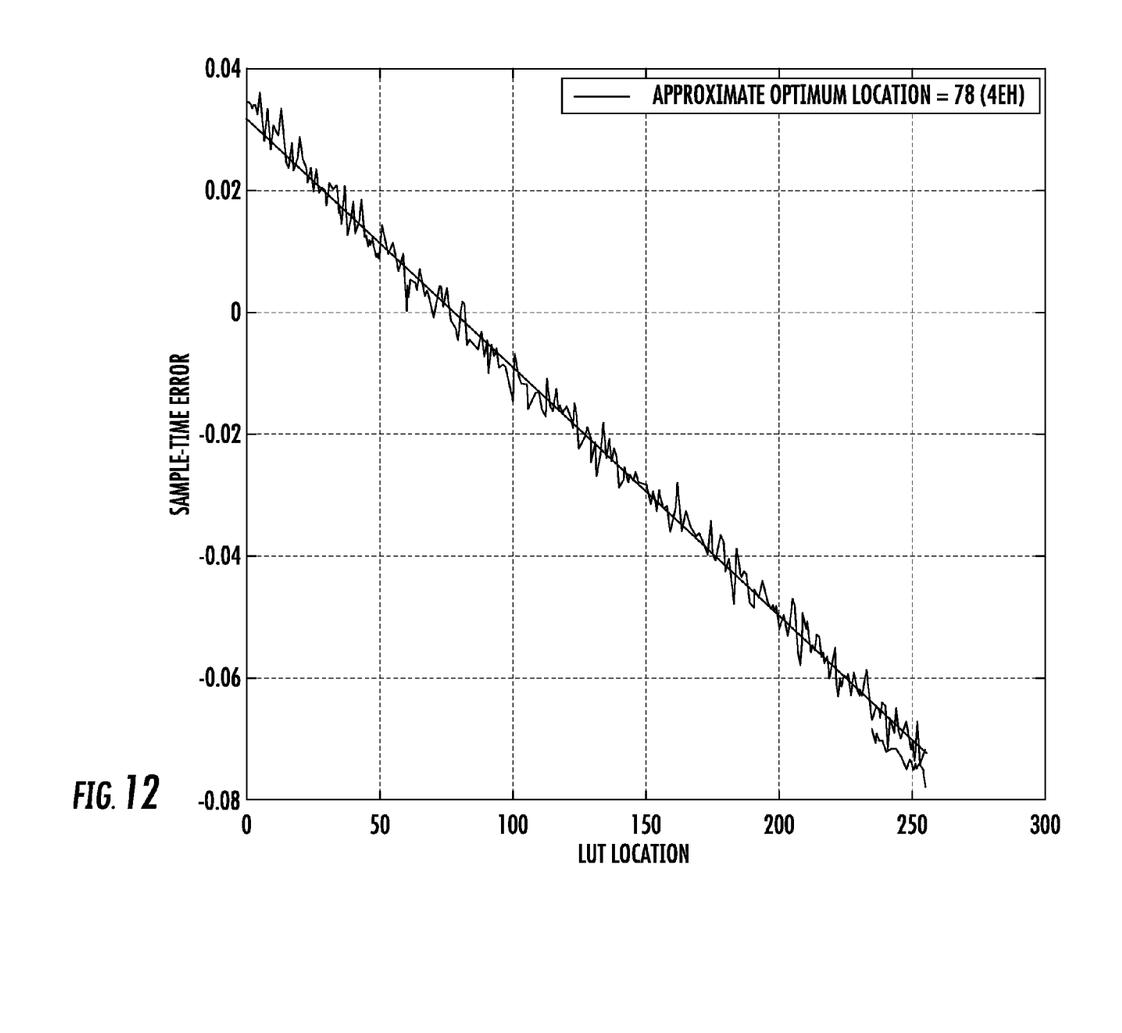
FIG. 12 illustrates phase error variation with the use of a lowpass filter.

FIG. 10 shows the spectrum of such an input signal.
FIG. 11 shows the variation of the gain error.
FIG. 12 shows the variation of the phase error.

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

What is claimed is:

1. An analog to digital converter (ADC) apparatus comprising:
    a clock signal generator, for generating a clock signal;
    a first ADC coupled to the clock signal generator, the first ADC converting an input signal to provide a first digital signal;
    a second ADC coupled to the clock signal generator, the second ADC converting the input signal to provide a second digital signal;
    wherein the input signal has an unused spectral portion that lies within a Nyquist zone of the first and second ADCs;
    a first digital filter, for filtering the first digital signal, to provide a first filtered signal, with the first digital filter having a frequency response that attenuates components of the first digital signal that aliased as a result of the first ADC;
    a second digital filter, for filtering the second digital signal, to provide a second filtered signal, the second digital filter having a frequency response that attenuates components of the second digital signal that are aliased as a result of the second ADC;
    an error measurement block coupled to receive the first and second filtered signals, the error measurement block producing an error measurement signal based on the first and second filtered signals;
    an adaptive processor coupled to receive the error signal, the adaptive processor estimating at least one of offset, gain, and sample-time error between the first and second ADCs based on the error measurement signal, the adaptive processor feeding back a correction signal corresponding to the estimated error to correct one of offset, gain, and sample-time error of at least one of the first and second ADCs; and
    a multiplexer, for interleaving the first and second digital signals to form a digital representation of the input signal.

2. The apparatus of claim 1 wherein the first digital filter has a pass band that passes components of the first digital signal that are not aliased as a result of the first ADC.

3. The apparatus of claim 2 wherein the second digital filter has a pass band that passes components of the second digital signal that are not aliased as a result of the second ADC.

4. The apparatus of claim 1 additionally comprising:
a switch, connected between at least one of the digital filters and the error measurement block, for selectively disabling the corresponding digital filter.

5. The apparatus of claim 4 wherein the switch is connected to enable the digital filter if aliased portions are expected to be present in the input signal.

6. The apparatus of claim 1 wherein a frequency response of the first or second digital filter depends on characteristics of the input signal.

7. The apparatus of claim 1 wherein at least one of the first or second digital filters is programmable.

8. The apparatus of claim 1 wherein an output of at least one of the first or second digital filters is used for correction of gain or phase.

9. The apparatus of claim 8 wherein at least one of the first or second digital signals is used for correction of offset.

10. The apparatus of claim 1 wherein the adaptive processor corrects gain error by measuring an error signal based on a difference in power of the first and second filtered signals.

11. The apparatus of claim 1 wherein the adaptive processor corrects sample-time error by determining a correlation between the first and second filtered signals.

12. The apparatus of claim 1 wherein the adaptive processor corrects offset, gain, and sample-time errors.

13. The apparatus of claim 1 further including one or more circuits responsive to the adaptive processor, to effect a change in an analog control input for at least one of an offset setting, gain setting, or delay setting of at least one of the first and second ADCs.

14. A method comprising:
converting an input signal with two Analog to Digital Converters (ADC) cores, to provide to a set of two ADC outputs as two digital signals, the input signal having an unused spectral portion that lies within a Nyquist zone of the first and second ADCs; and
at least one of the ADC cores having at least one of an offset correction, a gain correction, or a sample time correction;
interleaving the two digital signals output by the ADC cores to form a digital representation of the input signal;
filtering the two digital signals to produce corresponding two filtered signals, a frequency response of the filtering depending upon an expected aliasing characteristic of the input signal;
estimating at least one of gain or sample time error from at least one of the filtered signals; and
determining a corresponding one of the gain correction or phase correction, from the gain or sample time error, applied to at least one of the ADC cores.

15. The method of claim 14 wherein the input signal has an unused spectral portion that lies within a Nyquist zone of at least one of the ADC cores.

16. The method of claim 14 wherein the filtering has a frequency response that passes frequency components of the input signal that are not aliased as a result of operation of a corresponding ADC core.

17. The method of claim 14 additionally comprising:
selectively enabling or disabling at least one of the filtering steps.

18. The method of claim 17 wherein at least one of the filtering steps is disabled if aliased portions are not expected to be present in the input signal.

19. The method of claim 14 wherein at least one of the filtering steps is disabled, and further comprising correcting for offset.

20. The method of claim 14 wherein correcting gain error further comprises measuring an error based on a difference in power of two or more of the filtered signals.

21. The method of claim 14 wherein correcting sample-time error further comprises determining a correlation between two or more of the filtered signals.

22. The method of claim 14 wherein the correcting step corrects offset, gain, and sample-time errors.

23. The method of claim 14 further comprising:
effecting a change in an analog control input for at least one of an offset setting, gain setting, or delay setting of at least one of the first and second ADC cores.

24. The method of claim 14 wherein outputs of the two digital filters producing in the filtering step are used in an additional step of correcting for at least one of gain or phase.

25. A tangible, non-transitory, computer readable medium for storing computer executable instructions for converting an input signal, with the computer executable instructions for:
receiving two digital signals from a corresponding number of Analog to Digital Converters (ADC) cores, the input signal having an unused spectral portion that lies within a Nyquist zone of the first and second ADCs; and
at least some of the ADC cores having at least one of an offset correction input, a gain correction input, or a phase correction input;
filtering one or more of the two digital signals to produce corresponding one or more filtered signals, with a frequency response of the filtering depending upon an expected aliasing characteristic of the input signal;
estimating at least one of gain or sample time error from the one or more filtered signals; and
determining a corresponding one of the gain correction input or phase correction input, from the gain or sample time error, applied to at least one of the ADC cores.

* * * * *